United States Patent
Lo

(10) Patent No.: US 12,266,622 B2
(45) Date of Patent: Apr. 1, 2025

(54) METHOD OF MANUFACTURING SEMICONDUCTOR STRUCTURE HAVING HYBRID BONDING PAD

(71) Applicant: NANYA TECHNOLOGY CORPORATION, New Taipei (TW)

(72) Inventor: Yi-Jen Lo, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 490 days.

(21) Appl. No.: 17/840,081

(22) Filed: Jun. 14, 2022

(65) Prior Publication Data

US 2023/0402413 A1 Dec. 14, 2023

(51) Int. Cl.
*H01L 21/00* (2006.01)
*H01L 23/00* (2006.01)

(52) U.S. Cl.
CPC .............. *H01L 24/06* (2013.01); *H01L 24/08* (2013.01); *H01L 24/80* (2013.01); *H01L 2224/06517* (2013.01); *H01L 2224/08145* (2013.01); *H01L 2224/80895* (2013.01); *H01L 2224/80896* (2013.01)

(58) Field of Classification Search
CPC ...................... H01L 24/80; H01L 24/08; H01L 2224/08145; H01L 2224/80895; H01L 24/05; H01L 21/76877; H01L 2224/80906; H01L 24/16; H01L 2224/05008; H01L 2224/08123; H01L 2224/08121; H01L 2224/8034; H01L 2224/80894; H01L 2224/03013; H01L 2224/808; H01L 2224/80001; H01L 2225/06513; H01L 2224/73204; H01L 2225/06517; H01L 2225/06548; H01L 24/17; H01L 2224/0231; H01L 2224/0233; H01L 2224/05548; H01L 2224/13007; H01L 25/0756; H01L 24/06; H01L 2224/06517; H01L 2224/80896
See application file for complete search history.

(56) References Cited

U.S. PATENT DOCUMENTS

| 6,627,859 B1 * | 9/2003 | Kasai ................... G05D 23/306 219/505 |
| 8,809,123 B2 | 8/2014 | Liu et al. |
| 8,836,121 B2 | 9/2014 | Chen et al. |

(Continued)

FOREIGN PATENT DOCUMENTS

| TW | 201432828 A | 8/2014 |
| TW | 202115858 A | 4/2021 |

(Continued)

*Primary Examiner* — Niki H Nguyen
(74) *Attorney, Agent, or Firm* — MUNCY, GEISSLER, OLDS & LOWE, P.C.

(57) ABSTRACT

The present disclosure provides a method of manufacturing a semiconductor structure. The method includes providing a first semiconductor substrate. The method also includes forming a first conductive pad over the first semiconductor substrate. The method further includes forming a first hybrid bonding pad on the first conductive pad, wherein the first hybrid bonding pad includes nano-twins copper, and a thickness of the first hybrid bonding pad is less than a thickness of the first conductive pad.

9 Claims, 13 Drawing Sheets

(56) References Cited

U.S. PATENT DOCUMENTS

2014/0083361 A1* 3/2014 Rocha-Alvarez ............................ H01L 21/6719
                                                                      118/723 E
2022/0285303 A1* 9/2022 Mirkarimi ............... H01L 24/05

FOREIGN PATENT DOCUMENTS

| TW | I746310 B | 11/2021 |
| TW | 202104689 A | 12/2021 |

* cited by examiner

METHOD OF MANUFACTURING SEMICONDUCTOR STRUCTURE HAVING HYBRID BONDING PAD

TECHNICAL FIELD

The present disclosure relates to a method of manufacturing a semiconductor structure, and more particularly, to a method of manufacturing a semiconductor structure having one or more hybrid bonding pads.

DISCUSSION OF THE BACKGROUND

Semiconductor devices are essential for many modern applications. With the advancement of electronic technology, semiconductor devices are becoming smaller in size while having greater functionality and greater amounts of integrated circuitry. Due to the miniaturized scale of semiconductor devices, chip-on-chip technique is now widely used for manufacturing semiconductor packages.

In one approach, at least two chips (or dies) are stacked to form a 3D package so as to include greater amounts of integrated circuitry. A stacked package can provide improved mounting density and mounting area utilization efficiency. Due to such advantages, research and development of stacked package technology has accelerated.

The manufacturing of semiconductor devices is becoming more complex as well. One or more semiconductor devices may be assembled with a number of integrated components including various materials having different thermal properties. Because various components with different materials are combined in a package, the complexity of the manufacturing operations of the semiconductor device is increased accordingly. Therefore, there is a continuous need to improve the manufacturing process of semiconductor devices and address the above complexities.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor structure. The semiconductor structure includes a first semiconductor substrate, a first conductive pad, and a first hybrid bonding pad. The first conductive pad is over the first semiconductor substrate. The first hybrid bonding pad is on the first conductive pad. The first hybrid bonding pad includes nano-twins copper. A thickness of the first hybrid bonding pad is less than a thickness of the first conductive pad.

Another aspect of the present disclosure provides a semiconductor structure. The semiconductor structure includes a first semiconductor device, a first conductive pad, and a first nano-twins coper pad. The first conductive pad is disposed on and electrically connected to the first semiconductor device. The first nano-twins copper pad is on the first conductive pad. A thickness of the first nano-twins copper pad is less than a thickness of the first conductive pad.

Another aspect of the present disclosure provides a method of manufacturing a semiconductor structure. The method includes providing a first semiconductor substrate. The method also includes forming a first conductive pad over the first semiconductor substrate. The method further includes forming a first hybrid bonding pad on the first conductive pad, wherein the first hybrid bonding pad includes nano-twins copper, and a thickness of the first hybrid bonding pad is less than a thickness of the first conductive pad.

In the semiconductor structure, with the design of bonding surfaces of hybrid bonding pads including [112] crystal planes of nano-twins copper, since surface diffusion of copper atoms along the [111] crystal plane is significantly faster than along the [100] or [110] crystal planes, such specific [111] nano-twins crystal planes can increase the diffusion rate of copper atoms across a bonding interface between the hybrid bonding pads so as to form relatively stable metal-to-metal bonds in a hybrid bonding structure. Therefore, the bonding time can be reduced, the annealing temperature of the hybrid bonding process can be reduced, the stability of the hybrid bonding structure can be increased, and the bonding strength can be increased accordingly.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
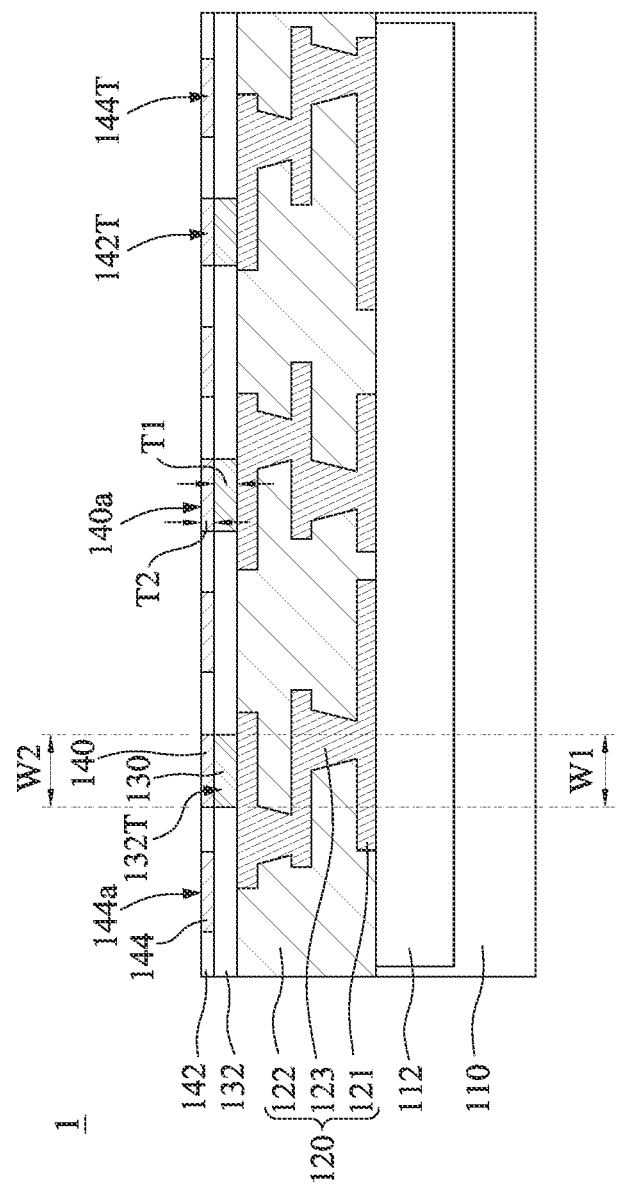
FIG. 1 is a cross-sectional view of a semiconductor structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor structure 1, in accordance with some embodiments of the present disclosure. The semiconductor structure 1 includes a semiconductor substrate 110, an interconnection structure 120, dielectric layers 132 and 142, one or more conductive pads 130, one or more hybrid bonding pads 140, and one or more dummy pads 144.

The semiconductor substrate 110 may be formed of or include, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material.

In some embodiments, the semiconductor substrate 110 includes a device region 112 including one or more semiconductor devices. In some embodiments, the one or more semiconductor devices include transistors, capacitors, resistors, diodes, or the like. In some embodiments, the one or more semiconductor devices may form an accelerated processing unit (APU), a central processing unit (CPU) a graphic processing unit (GPU), microprocessors, application-specific integrated circuits (ASICs), digital signal processors (DSPs), memories, dynamic random access memories (DRAMs), NAND flash memory, or the like.

The interconnection structure 120 may be on the semiconductor substrate 110. In some embodiments, the interconnection structure 120 includes a plurality of connecting lines 121 and a plurality of connecting vias 123 disposed in a plurality of dielectric layers 122. In some embodiments, the plurality of connecting lines 121 are electrically connected by the plurality of connecting vias 123. Further, the abovementioned device region 112 may be electrically connected to the interconnection structure 120. The plurality of connecting lines 121 and the plurality of connecting vias 123 may include aluminium (Al), copper (Cu), or tungsten (W), but the disclosure is not limited thereto. In some embodiments, a diffusion barrier layer (not shown) such as, for example but not limited thereto, titanium nitride (TiN) or tantalum nitride (TaN) may be disposed between the plurality of connecting lines/connecting vias 121/123 and the plurality of dielectric layers 122. The plurality of dielectric layers 122 may be, for example but not limited thereto, silicon oxide ($SiO_x$), phosphosilicate glass (PSG), borophosphosilicate glass (BPSG), or a low dielectric constant (k) material, such as fluorosilicate glass (FSG), organosilicate glass (OSG), or a combination thereof.

The dielectric layer 132 may be over the semiconductor substrate 110. In some embodiments, the dielectric layer 132 is on the interconnection structure 120. In some embodiments, the dielectric layer 132 has one or more trenches 132T. The trenches 132T may be openings or through holes. In some embodiments, the trenches 132T penetrate the dielectric layer 132 to expose portions of the interconnection structure 120. In some embodiments, portions of the topmost connecting line 121 are exposed by the trenches 132T. The dielectric layer 132 may be formed of or include a dielectric material such as silicon oxide ($SiO_x$), silicon nitride ($SiN_x$), silicon oxynitride ($SiO_xN_y$), silicon carbonitride ($SiC_xN_y$), or a combination thereof. In some embodiments, the dielectric layer 132 includes silicon oxide.

The conductive pad 130 may be over the semiconductor substrate 110. The conductive pad 132 may be referred to as conductive via or conductive pillar. In some embodiments, the conductive pad 130 is on the interconnection structure 120. In some embodiments, the conductive pad 130 is disposed on and electrically connected to the one or more semiconductor devices of the device region 112 of the semiconductor substrate 110. The conductive pad 130 may include aluminum, copper, tungsten, cobalt, or a combination thereof. In some embodiments, the conductive pad 130 includes copper. In some embodiments, the conductive pad 130 includes nano-twins copper.

In some embodiments, the conductive pad 130 is embedded in the dielectric layer 132. In some embodiments, a top surface of the conductive pad 130 is exposed from the dielectric layer 132. In some embodiments, the conductive pad 130 is in the trench 132T and directly contacts the dielectric layer 132. In some embodiments, the interconnection structure 120 is between the conductive pad 130 and the semiconductor substrate 110. In some embodiments, the interconnection structure 120 electrically connects the conductive pad 130 to the one or more semiconductor devices of the device region 112 of the semiconductor substrate 110.

In some embodiments, the conductive pad 130 has a thickness T1 that is equal to or greater than about 200 nm. In some embodiments, the thickness T1 of the conductive pad 130 is from about 200 nm to about 800 nm, from about 300 nm to about 700 nm, from about 400 nm to about 600 nm, or about 500 nm. In some embodiments, the top surface of the conductive pad 130 is substantially coplanar with a top surface of the dielectric layer 132. In some embodiments, the dielectric layer 132 has a thickness that is substantially the same as the thickness T1 of the conductive pad 130.

The dielectric layer 142 may be over the conductive pad 130. In some embodiments, the dielectric layer 142 is on the dielectric layer 132. In some embodiments, the dielectric layer 142 has one or more trenches 142T' and one or more trenches 144T'. The trenches 142T and 144T may be openings or through holes. In some embodiments, the one or more trenches 142T penetrate the dielectric layer 142 to expose portions of the one or more conductive pads 130. In some embodiments, the one or more trenches 144T penetrate the dielectric layer 142 to expose portions of the dielectric layer 132. The dielectric layer 142 may be formed of or include a dielectric material such as silicon oxide ($SiO_x$), silicon nitride ($SiN_x$), silicon oxynitride ($SiO_xN_y$), silicon carbonitride ($SiC_xN_y$), or a combination thereof. In some embodiments, the dielectric layer 142 includes silicon carbonitride.

The hybrid bonding pad 140 may be on the conductive pad 130. In some embodiments, the hybrid bonding pad 140 is electrically connected to the conductive pad 130. In some embodiments, the hybrid bonding pad 140 directly contacts the conductive pad 130. In some embodiments, the hybrid bonding pad 140 includes nano-twins copper. The hybrid bonding pad 140 may be referred to as a nano-twins copper pad.

In some embodiments, the hybrid bonding pad 140 is embedded in the dielectric layer 142. In some embodiments, a top surface 140a (also referred to as "a hybrid bonding surface") of the hybrid bonding pad 140 is exposed from the dielectric layer 142. In some embodiments, the hybrid bonding pad 140 is in the trench 142T and directly contacts the dielectric layer 142. In some embodiments, the conductive pad 130 electrically connects the hybrid bonding pad 140 to the interconnection structure 120.

In some embodiments, the hybrid bonding pad 140 has a thickness T2 that is equal to or less than about 100 nm. In some embodiments, the thickness T2 of the hybrid bonding pad 140 is equal to or less than about 80 nm. In some embodiments, the thickness T2 of the hybrid bonding pad 140 is from about 20 nm to about 100 nm, from about 30n to about 70 nm, from about 40 nm to about 60 nm, or about 50 nm. In some embodiments, the thickness T2 of the hybrid bonding pad 140 is less than the thickness T1 of the conductive pad 130. In some embodiments, a ratio (T2/T1) of the thickness T2 to the thickness T1 is equal to or less than about 0.5, equal to or less about 0.3, equal to or less than about 0.2, or equal to or less than about 0.1. In some embodiments, the top surface 140a (or the hybrid bonding surface) of the hybrid bonding pad 140 is substantially coplanar with atop surface of the dielectric layer 142. In some embodiments, the dielectric layer 142 has a thickness that is substantially the same as the thickness T2 of the hybrid bonding pad 140.

In some embodiments, a size of the hybrid bonding pad 140 may be equal to or greater than a size of the conductive pad 130. For example, a cross-sectional width of the hybrid bonding pad 140 may be equal to or greater than a cross-sectional width of the conductive pad 130. In some embodiments, a cross-sectional width W2 of the hybrid bonding pad 140 is substantially equal to a cross-sectional width W1 of the conductive pad 130.

In some embodiments, the top surface 140a (or the hybrid bonding surface) of the hybrid bonding pad 140 includes a [111] crystal plane. In some embodiments, the top surface 140a (or the hybrid bonding surface) of the hybrid bonding pad 140 includes a [111] crystal plane of nano-twins copper. In some embodiments, at least 80% of a surface area of the top surface 140a (or the hybrid bonding surface) of the hybrid bonding pad 140a is the [111] crystal plane of nano-twins copper. In some embodiments, at least 85%, 90%, 95%, or 98% of a surface area of the top surface 140a (or the hybrid bonding surface) of the hybrid bonding pad 140a is the [111] crystal plane of nano-twins copper.

The dummy pad 144 may be on the dielectric layer 132. In some embodiments, the dummy pad 144 directly contacts the dielectric layer 132. In some embodiments, the dummy pad 144 is electrically isolated from the conductive pads 130. In some embodiments, the dummy pad 144 includes nano-twins copper.

In some embodiments, the dummy pad 144 is embedded in the dielectric layer 142. In some embodiments, a top surface 144a (also referred to as "a hybrid bonding surface") of the dummy pad 144 is exposed from the dielectric layer 142. In some embodiments, the dummy pad 144 is in the trench 144T and directly contacts the dielectric layer 142.

In some embodiments, the thickness of the dummy pad 144 is less than the thickness T1 of the conductive pad 130. In some embodiments, the dummy pad 144 has a thickness that is substantially the same as the thickness T2 of the hybrid bonding pad 140. In some embodiments, the top surface 144a (or the hybrid bonding surface) of the dummy pad 144 is substantially coplanar with a top surface of the dielectric layer 142. In some embodiments, the dielectric layer 142 has a thickness that is substantially the same as the thickness of the dummy pad 144.

According to some embodiments of the present disclosure, with the design of the bonding surface of the hybrid bonding pads 140 including a [111] crystal plane of nano-twins copper, since surface diffusion of copper atoms along the [111] crystal plane is significantly faster than along the [100] or [110] crystal planes, such specific [111] nano-twins crystal plane can increase the diffusion rate of copper atoms across a bonding interface so as to form relatively stable metal-to-metal bonds in a hybrid bonding structure. Therefore, the bonding time can be reduced, the annealing temperature of the hybrid bonding process can be reduced, the stability of the hybrid bonding structure can be increased, and the bonding strength can be increased accordingly.

Figure 2:
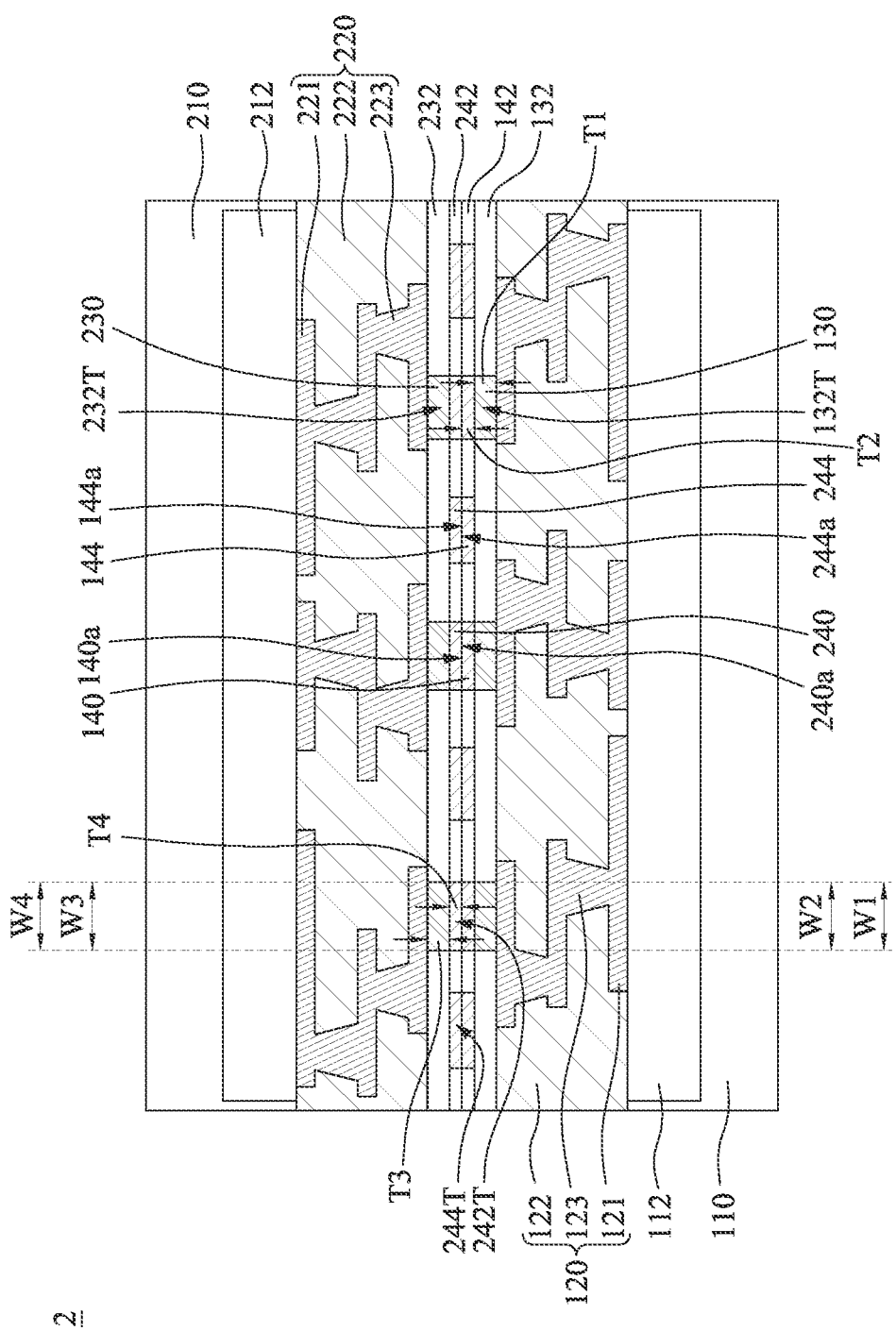
FIG. 2 is a cross-sectional view of a semiconductor structure, in accordance with some embodiments of the present disclosure.

FIG. 2 is a cross-sectional view of a semiconductor structure 2, in accordance with some embodiments of the present disclosure. The semiconductor structure 2 is similar to the semiconductor structure 1 shown in FIG. 1, with differences therebetween as follows. Descriptions of similar components are omitted.

In some embodiments, the semiconductor structure 2 includes semiconductor substrates 120 and 210, an interconnection structure 120, dielectric layers 132, 142, 232, and 242, one or more conductive pads 130 and 230, one or more hybrid bonding pads 140 and 240, and one or more dummy pads 144 and 244.

The semiconductor substrate 210 may be formed of or include, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, II-V or I-VI semiconductor material.

In some embodiments, the semiconductor substrate 210 includes a device region 212 including one or more semiconductor devices. In some embodiments, the one or more semiconductor devices include transistors, capacitors, resistors, diodes, or the like. In some embodiments, the one or more semiconductor devices may form an accelerated processing unit (APU), a central processing unit (CPU), a graphic processing unit (GPU), microprocessors, application-specific integrated circuits (ASICs), digital signal processors (DSPs), memories, dynamic random access memories (DRAMs), NAND flash memory, or the like.

The interconnection structure 220 may be on the semiconductor substrate 210. In some embodiments, the interconnection structure 220 includes a plurality of connecting lines 221 and a plurality of connecting vias 223 disposed in a plurality of dielectric layers 222. In some embodiments, the plurality of connecting lines 221 are electrically connected by the plurality of connecting vias 223. Further, the abovementioned device region 212 may be electrically connected to the interconnection structure 220. The plurality of connecting lines 221 and the plurality of connecting vias 223 may include aluminum (Al), copper (CPu), or tungsten (W), but the disclosure is not limited thereto. In some embodiments, a diffusion barrier layer (not shown) such as, for example but not limited thereto, titanium nitride (TiN) or tantalum nitride (TaN) may be disposed between the plurality of connecting lines/connecting vias 221/223 and the plurality of dielectric layers 222. The plurality of dielectric layers 222 may be, for example but not limited thereto, silicon oxide ($SiO_x$), phosphosilicate glass (PSG), borophosphosilicate glass (BPSG), or a low dielectric constant (k) material, such as fluorosilicate glass (FSG), organosilicate glass (OSG), or a combination thereof.

The dielectric layer 232 may be over the semiconductor substrate 210. In some embodiments, the dielectric layer 232 is on the interconnection structure 220. In some embodiments, the dielectric layer 232 has one or more trenches 232T. The trenches 232T may be openings or through holes. In some embodiments, the trenches 232T penetrate the dielectric layer 232 to expose portions of the interconnection structure 220. In some embodiments, portions of the topmost connecting line 221 are exposed by the trenches 232T. The dielectric layer 232 may be formed of or include a dielectric material such as silicon oxide ($SiO_x$), silicon nitride ($SiN_x$), silicon oxynitride ($SiO_xN_y$), silicon carbonitride ($SiC_xN_y$), or a combination thereof. In some embodiments, the dielectric layer 232 includes silicon oxide.

The conductive pad 230 may be over the semiconductor substrate 210. The conductive pad 232 may be referred to as conductive via or conductive pillar. In some embodiments, the conductive pad 230 is on the interconnection structure 220. In some embodiments, the conductive pad 230 is disposed on and electrically connected to the one or more semiconductor devices of the device region 212 of the semiconductor substrate 210. The conductive pad 230 may include aluminum, copper, tungsten, cobalt, or a combination thereof. In some embodiments, the conductive pad 230 includes copper. In some embodiments, the conductive pad 230 includes nano-twins copper.

In some embodiments, the conductive pad 230 is embedded in the dielectric layer 232. In some embodiments, a top surface of the conductive pad 230 is exposed from the dielectric layer 232. In some embodiments, the conductive pad 230 is in the trench 232T and directly contacts the dielectric layer 232. In some embodiments, the interconnection structure 220 is between the conductive pad 230 and the semiconductor substrate 210. In some embodiments, the interconnection structure 220 electrically connects the conductive pad 230 to the one or more semiconductor devices of the device region 212 of the semiconductor substrate 210.

In some embodiments, the conductive pad 230 has a thickness T3 that is equal to or greater than about 200 nm. In some embodiments, the thickness T3 of the conductive pad 230 is from about 200 nm to about 800 nm, from about 300 nm to about 700 nm, from about 400 nm to about 600 nm, or about 500 nm. In some embodiments, the top surface of the conductive pad 230 is substantially coplanar with a top surface of the dielectric layer 232. In some embodiments, the dielectric layer 232 has a thickness that is substantially the same as the thickness T3 of the conductive pad 230.

The dielectric layer 242 may be over the conductive pad 230. In some embodiments, the dielectric layer 242 is on the dielectric layer 232. In some embodiments, the dielectric layer 242 has one or more trenches 242T and one or more trenches 244T. The trenches 242T and 244T may be openings or through holes. In some embodiments, the one or more trenches 242T penetrate the dielectric layer 242 to expose portions of the one or more conductive pads 230. In some embodiments, the one or more trenches 244T penetrate the dielectric layer 242 to expose portions of the dielectric layer 232. The dielectric layer 242 may be formed of or include a dielectric material such as silicon oxide ($SiO_x$) silicon nitride ($SiN_x$), silicon oxynitride ($SiO_xN_y$), silicon carbonitride ($SiC_xN_y$), or a combination thereof. In some embodiments, the dielectric layer 242 includes silicon carbonitride.

The hybrid bonding pad 240 may be on the conductive pad 230. In some embodiments, the hybrid bonding pad 240 is electrically connected to the conductive pad 230. In some embodiments, the hybrid bonding pad 240 directly contacts the conductive pad 230. In some embodiments, the hybrid bonding pad 240 includes nano-twins copper. The hybrid bonding pad 240 may be referred to as a nano-twins copper pad.

In some embodiments, the hybrid bonding pad 240 is embedded in the dielectric layer 242. In some embodiments, a top surface 240a (also referred to as "a hybrid bonding surface") of the hybrid bonding pad 240 is exposed from the dielectric layer 242. In some embodiments, the hybrid bonding pad 240 is in the trench 242T and directly contacts the dielectric layer 242. In some embodiments, the conductive pad 230 electrically connects the hybrid bonding pad 240 to the interconnection structure 220.

In some embodiments, the hybrid bonding pad 240 has a thickness T4 that is equal to or less than about 100 nm. In some embodiments, the thickness T4 of the hybrid bonding pad 240 is equal to or less than about 80 nm. In some embodiments, the thickness T4 of the hybrid bonding pad 240 is from about 20 nm to about 100 nm, from about 30 nm to about 70 nm, from about 40 nm to about 60 nm, or about 50 nm. In some embodiments, the thickness T4 of the hybrid bonding pad 240 is less than the thickness T3 of the conductive pad 230. In some embodiments, a ratio (T4/T3) of the thickness T4 to the thickness T3 is equal to or less than about 0.5, equal to or less about 0.3, equal to or less than about 0.2, or equal to or less than about 0.1. In some embodiments, the top surface 240a (or the hybrid bonding surface) of the hybrid bonding pad 240 is substantially coplanar with a top surface of the dielectric layer 242. In some embodiments, the dielectric layer 242 has a thickness that is substantially the same as the thickness T4 of the hybrid bonding pad 240.

In some embodiments, a size of the hybrid bonding pad 240 may be equal to or greater than a size of the conductive pad 230. For example, a cross-sectional width of the hybrid bonding pad 240 may be equal to or greater than a cross-sectional width of the conductive pad 230. In some embodiments, a cross-sectional width W4 of the hybrid bonding pad 240 is substantially equal to a cross-sectional width W3 of the conductive pad 230.

In some embodiments, the top surface 240a (or the hybrid bonding surface) of the hybrid bonding pad 240 includes a [111] crystal plane. In some embodiments, the top surface 240a (or the hybrid bonding surface) of the hybrid bonding pad 240 includes a [111] crystal plane of nano-twins copper. In some embodiments, at least 80% of a surface area of the top surface 240a (or the hybrid bonding surface) of the hybrid bonding pad 240a is the [111] crystal plane of nano-twins copper. In some embodiments, at least 85%, 90%, 95%, or 98% of a surface area of the top surface 240a (or the hybrid bonding surface) of the hybrid bonding pad 240a is the [111] crystal plane of nano-twins copper.

The dummy pad 244 may be on the dielectric layer 232. In some embodiments, the dummy pad 244 directly contacts the dielectric layer 232. In some embodiments, the dummy pad 244 is electrically isolated from the conductive pads 230. In some embodiments, the dummy pad 244 includes nano-twins copper.

In some embodiments, the dummy pad 244 is embedded in the dielectric layer 242. In some embodiments, a top surface 244a (also referred to as "a hybrid bonding surface") of the dummy pad 244 is exposed from the dielectric layer 242. In some embodiments, the dummy pad 244 is in the trench 244T and directly contacts the dielectric layer 242.

In some embodiments, the thickness of the dummy pad 244 is less than the thickness T3 of the conductive pad 230. In some embodiments, the dummy pad 244 has a thickness that is substantially the same as the thickness T4 of the hybrid bonding pad 240. In some embodiments, the top surface 244a (or the hybrid bonding surface) of the dummy pad 244 is substantially coplanar with a top surface of the dielectric layer 242. In some embodiments, the dielectric layer 242 has a thickness that is substantially the same as the thickness of the dummy pad 244.

In some embodiments, the hybrid bonding pad 140 (or the nano-twins copper pad) is bonded to the hybrid bonding pad 240 (or the nano-twins copper pad). In some embodiments, the top surface 140a (or the hybrid bonding surface) of the hybrid bonding pad 140 is bonded to the top surface 240a (or the hybrid bonding surface) of the hybrid bonding pad 240. In some embodiments, the [111] crystal plane of the top surface 140a of the hybrid bonding pad 140 (or the nano-twins copper pad) is bonded to the [111] crystal plane of the top surface 240a of the hybrid bonding pad 240 (or the nano-twins copper pad).

In some embodiments, the dummy pad 144 (or the nano-twins copper pad) is bonded to the dummy pad 244 (or the nano-twins copper pad). In some embodiments, the top surface 144a (or the hybrid bonding surface) of the dummy pad 144 is bonded to the top surface 244a (or the hybrid bonding surface) of the dummy pad 244. In some embodiments, the [111] crystal plane of the top surface 144a of the dummy pad 144 (or the nano-twins copper pad) is bonded to the [111] crystal plane of the top surface 244a of the dummy pad 244 (or the nano-twins copper pad).

In some embodiments, the dielectric layer 142 is bonded to the dielectric layer 242. In some embodiments, the hybrid bonding pads 140 and 240 and the dielectric layers 142 and 242 form a hybrid bonding structure which bonds the semiconductor substrate 110 to the semiconductor substrate 210. In some embodiments, the hybrid bonding pads 140 and 240, the dummy pads 144 and 244, and the dielectric layers 142 and 242 form a hybrid bonding structure which bonds the semiconductor substrate 110 to the semiconductor substrate 210.

According to some embodiments of the present disclosure, with the design of the bonding surfaces of the hybrid bonding pads 140 and 240 including [111] crystal planes of nano-twins copper, since surface diffusion of copper atoms along the [111] crystal plane is significantly faster than along the [100] or [110] crystal planes, such specific [111] nano-twins crystal planes can increase the diffusion rate of copper atoms across a bonding interface between the hybrid bonding pads 140 and 240 so as to form relatively stable metal-to-metal bonds in a hybrid bonding structure. Therefore, the bonding time can be reduced, the annealing temperature of the hybrid bonding process can be reduced, the stability of the hybrid bonding structure can be increased, and the bonding strength can be increased accordingly.

Figure 3:
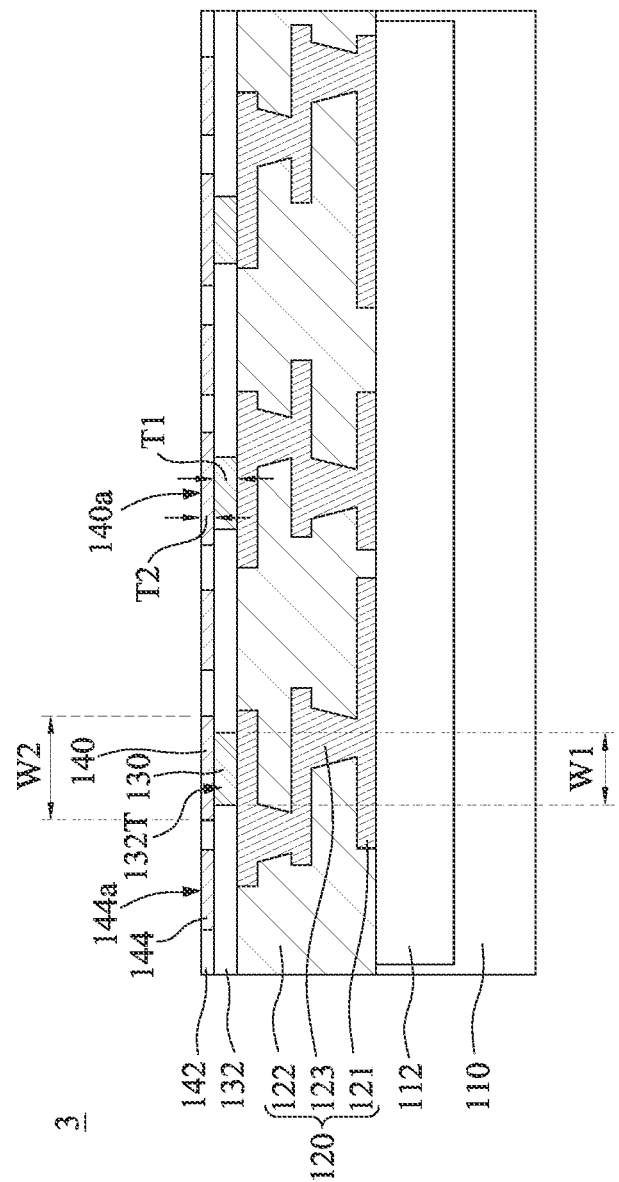
FIG. 3 is a cross-sectional view of a semiconductor structure, in accordance with some embodiments of the present disclosure.

FIG. 3 is a cross-sectional view of a semiconductor structure 3, in accordance with some embodiments of the present disclosure. The semiconductor structure 3 is similar to the semiconductor structure 1 shown in FIG. 1, with differences therebetween as follows. Descriptions of similar components are omitted.

In some embodiments, a size of the hybrid bonding pad 140 may be greater than a size of the conductive pad 130. In some embodiments, a cross-sectional width W2 of the hybrid bonding pad 140 is greater than a cross-sectional width W1 of the conductive pad 130.

According to some embodiments of the present disclosure, with the design of the size of the hybrid bonding pad 140 being greater than a size of the conductive pad 130, the size of the contact via within the hybrid bonding structure can be enlarged. Therefore, the resistance can be reduced, and the electrical performance can be increased.

Figure 4:
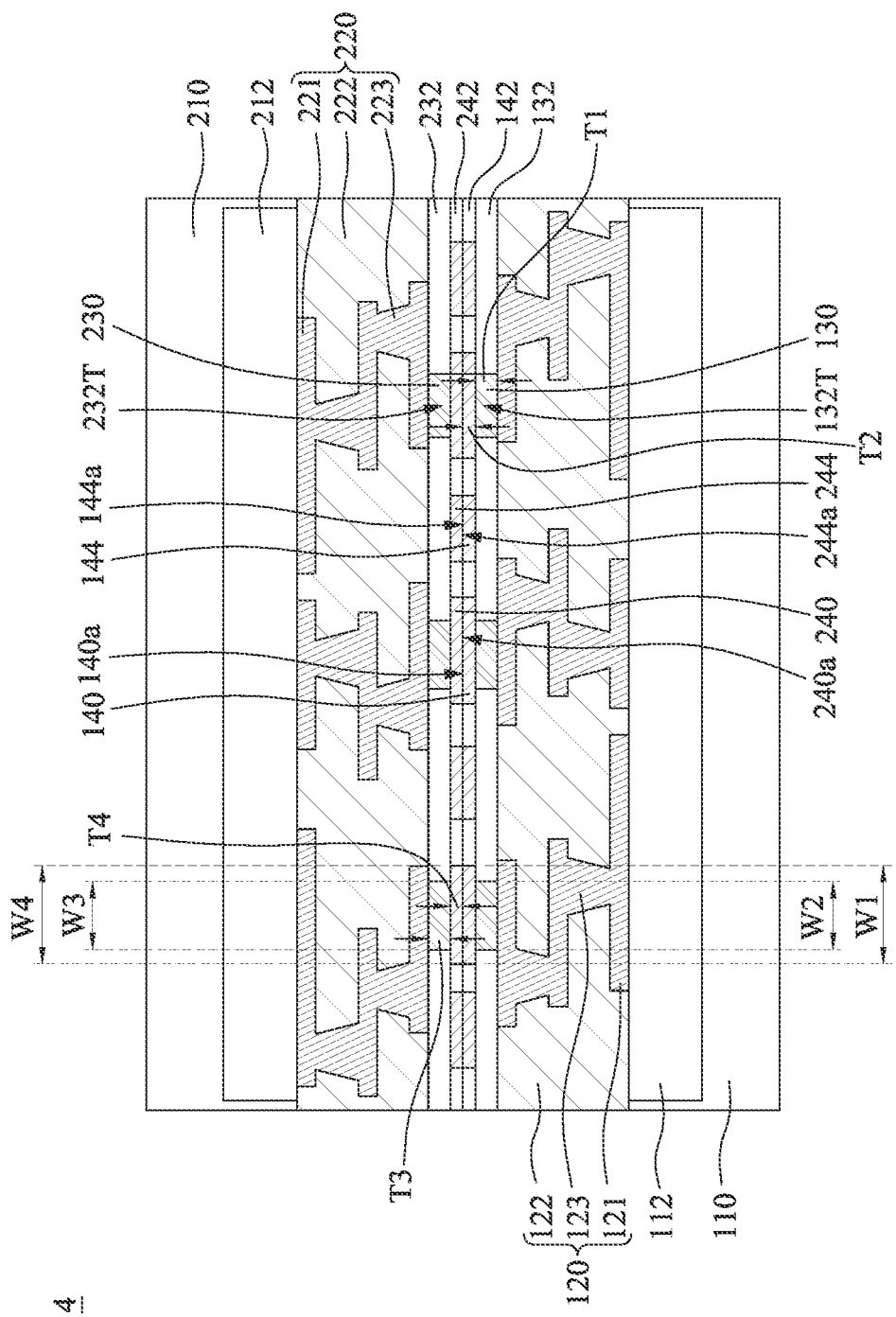
FIG. 4 is a cross-sectional view of a semiconductor structure, in accordance with some embodiments of the present disclosure.

FIG. 4 is a cross-sectional view of a semiconductor structure 4, in accordance with some embodiments of the present disclosure. The semiconductor structure 4 is similar to the semiconductor structure 3 shown in FIG. 3, with differences therebetween as follows. Descriptions of similar components are omitted.

In some embodiments, a size of the hybrid bonding pad 240 may be greater than a size of the conductive pad 230. In some embodiments, a cross-sectional width W4 of the hybrid bonding pad 240 is greater than a cross-sectional width W3 of the conductive pad 230.

According to some embodiments of the present disclosure, with the design of the size of the hybrid bonding pad 140 being greater than a size of the conductive pad 130 and the size of the hybrid bonding pad 240 being greater than a size of the conductive pad 230, the size of the contact via within the hybrid bonding structure can be enlarged. Therefore, the resistance can be reduced, and the electrical performance can be increased.

FIG. 5A to FIG. 5H illustrate various stages of a method of manufacturing a semiconductor structure 4, in accordance with some embodiments of the present disclosure.

Figure 5A:
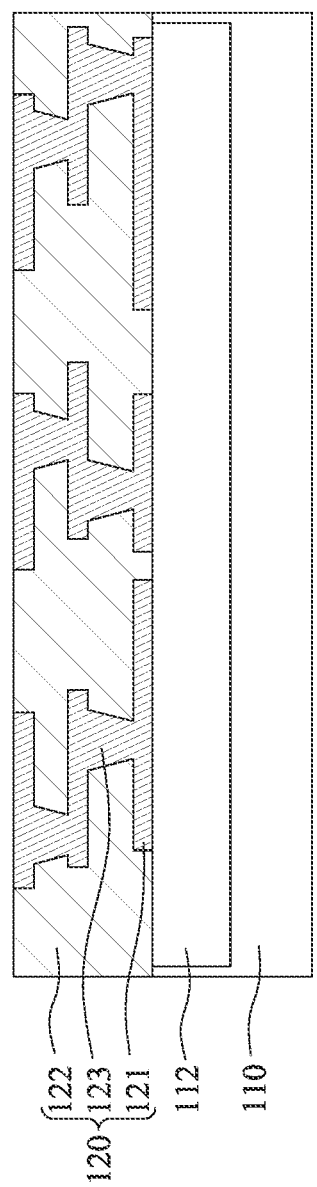
FIG. 5A illustrates one or more stages of a method of manufacturing a semiconductor structure, in accordance with some embodiments of the present disclosure.

Referring to FIG. 5A, a semiconductor substrate 110 may be provided, and an interconnection structure 120 may be formed on the semiconductor substrate 110. In some embodiments, the semiconductor substrate 110 includes a device region 112 including one or more semiconductor devices. In some embodiments, the interconnection structure 120 includes a plurality of connecting lines 121 and a plurality of connecting vias 123 disposed in a plurality of dielectric layers 122.

Figure 5B:
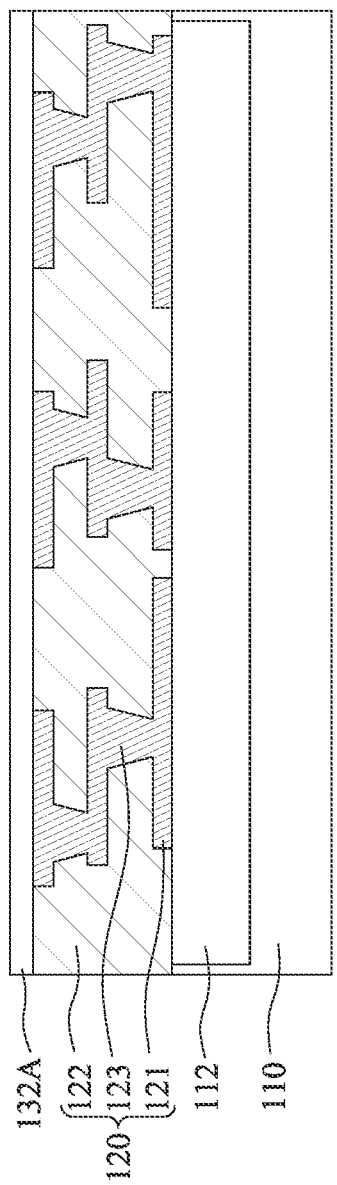
FIG. 5B illustrates one or more stages of a method of manufacturing a semiconductor structure, in accordance with some embodiments of the present disclosure.

Referring to FIG. 5B, a dielectric layer 132A may be formed over the semiconductor substrate 110. In some embodiments, the dielectric layer 132A is formed on the interconnection structure 120 by deposition. The dielectric layer 132A may be formed of or include a dielectric material such as silicon oxide ($SiO_x$), silicon nitride ($SiN_x$), silicon oxynitride ($SiO_xN_y$), silicon carbonitride ($SiC_xN_y$), or a combination thereof. In some embodiments, the dielectric layer 132A includes silicon oxide.

Figure 5C:
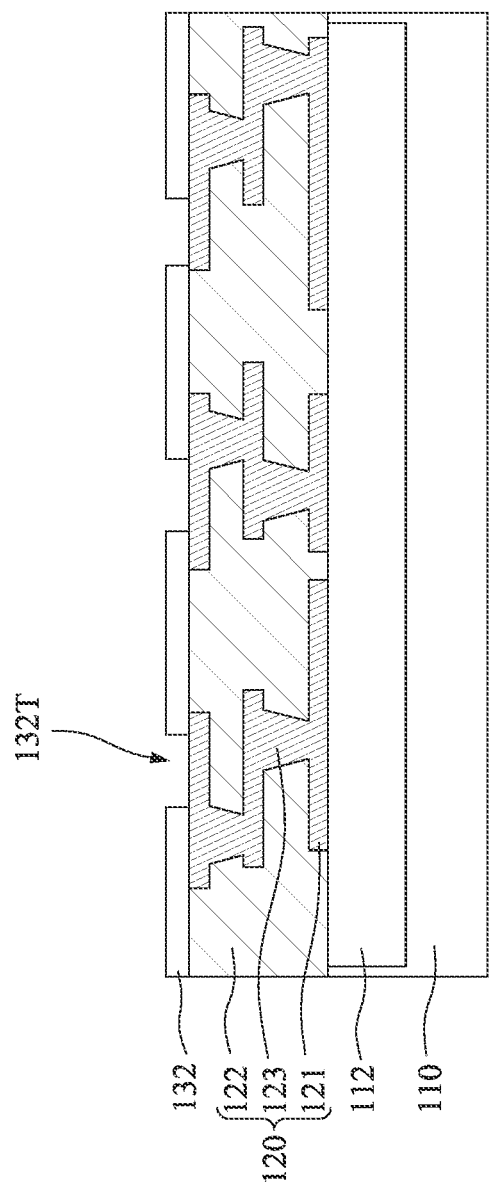
FIG. 5C illustrates one or more stages of a method of manufacturing a semiconductor structure, in accordance with some embodiments of the present disclosure.

Referring to FIG. 5C, one or more trenches 132T may be formed in the dielectric layer 132. In some embodiments, the trenches 132T may be formed forming a patterned photoresist on the dielectric layer 132A, etching the dielectric layer 132A to remove portions of the dielectric layer 132A exposed by the patterned photoresist to form the dielectric layer 132 having the trenches 132T, and removing the patterned photoresist.

Figure 5D:
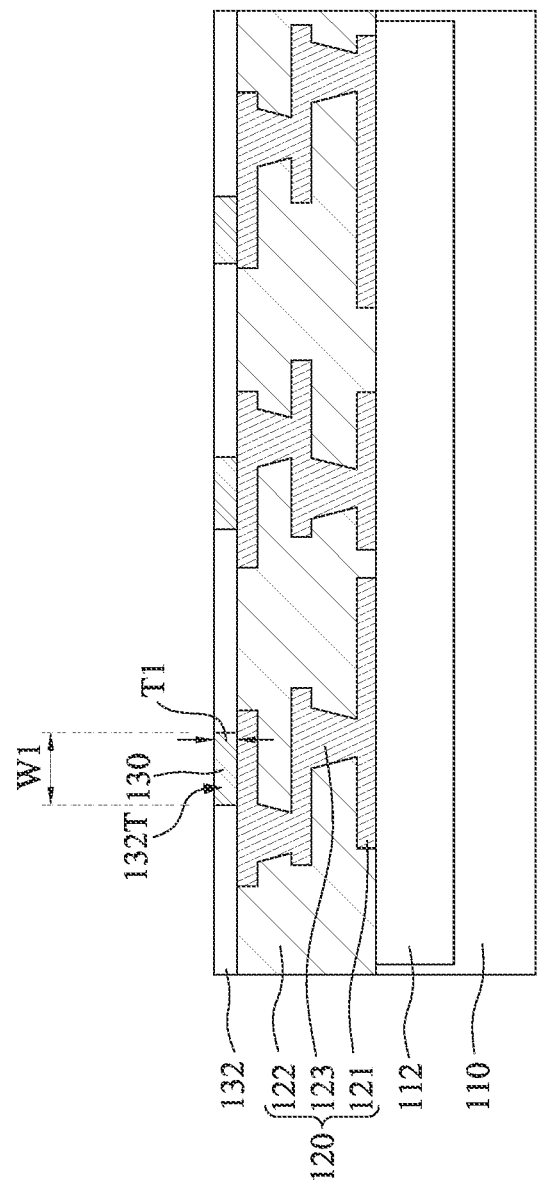
FIG. 5D illustrates one or more stages of a method of manufacturing a semiconductor structure, in accordance with some embodiments of the present disclosure.

Referring to FIG. 5D, one or more conductive pads 130 may be formed over the semiconductor substrate 110. In some embodiments, the one or more conductive pads 130 are formed on the interconnection structure 120. In some embodiments, a conductive material is deposited in the trenches 132T, and a planarization process such as a chemical mechanical polishing (CMP) may be performed to remove a portion of the conductive material and optionally a portion of the dielectric layer 132. In some embodiments, the conductive material may be deposited in the trenches 132T by electrochemical deposition (ECD). The conductive material may include copper. In some embodiments, a thickness T1 of the conductive pad 130 is substantially the same as a depth of the trench 132T.

Figure 5E:
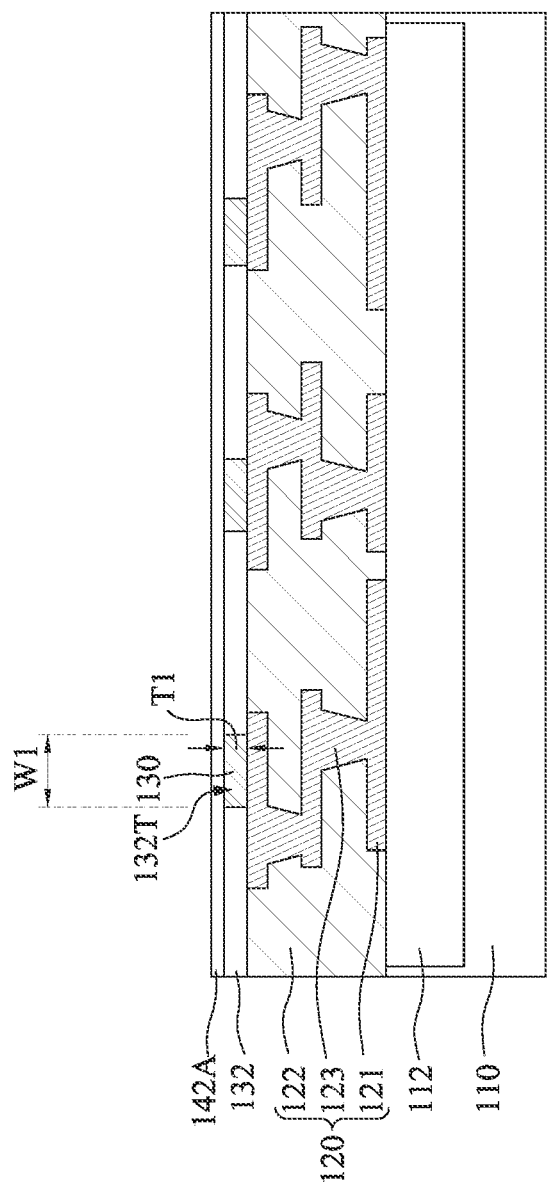
FIG. 5E illustrates one or more stages of a method of manufacturing a semiconductor structure, in accordance with some embodiments of the present disclosure.

Referring to FIG. 5E, a dielectric layer 142A may be formed on the dielectric layer 132 and the conductive pads 130. In some embodiments, the dielectric layer 142A is formed by deposition. The dielectric layer 142A may be formed of or include a dielectric material such as silicon oxide ($SiO_x$), silicon nitride ($SiN_x$), silicon oxynitride ($SiO_xN_y$), silicon carbonitride ($SiC_xN_y$), or a combination thereof. In some embodiments, the dielectric layer 142A includes silicon carbonitride.

Figure 5F:
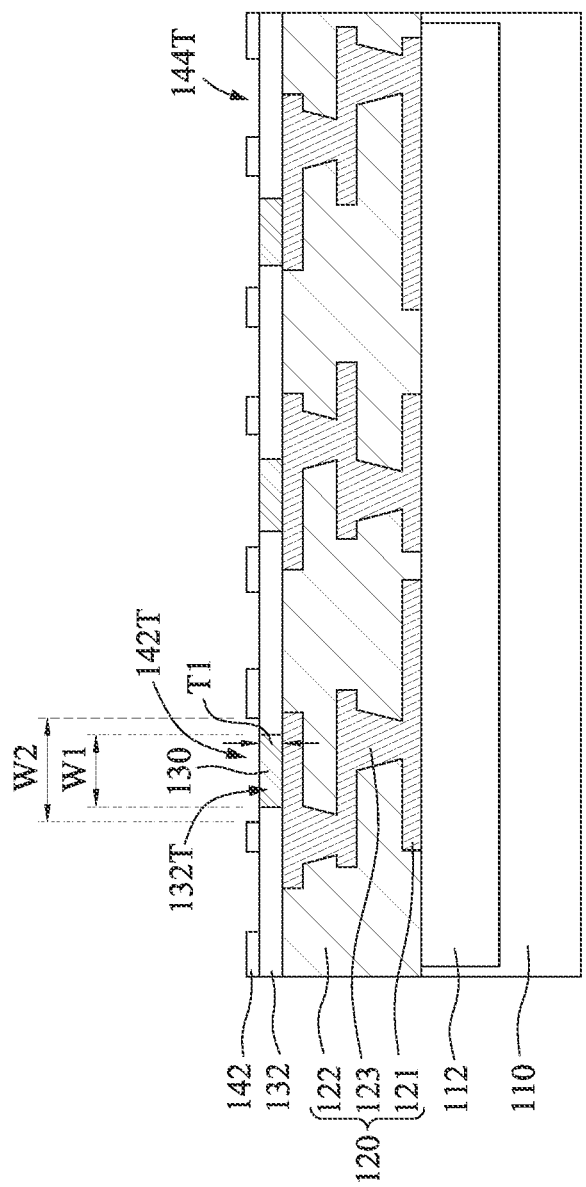
FIG. 5F illustrates one or more stages of a method of manufacturing a semiconductor structure, in accordance with some embodiments of the present disclosure.

Referring to FIG. 5F, one or more trenches 142T may be formed in the dielectric layer 132. In some embodiments, the trenches 142T penetrate the dielectric layer 142 to expose the conductive pads 130. In some embodiments, a depth of the trench 142T is less than a depth of the trench 132T. In some embodiments, the trenches 142T may be formed forming a patterned photoresist on the dielectric layer 142A, etching the dielectric layer 142A to remove portions of the dielectric layer 142A exposed by the patterned photoresist to form the dielectric layer 14 having the trenches 142T, and removing the patterned photoresist.

Figure 5G:
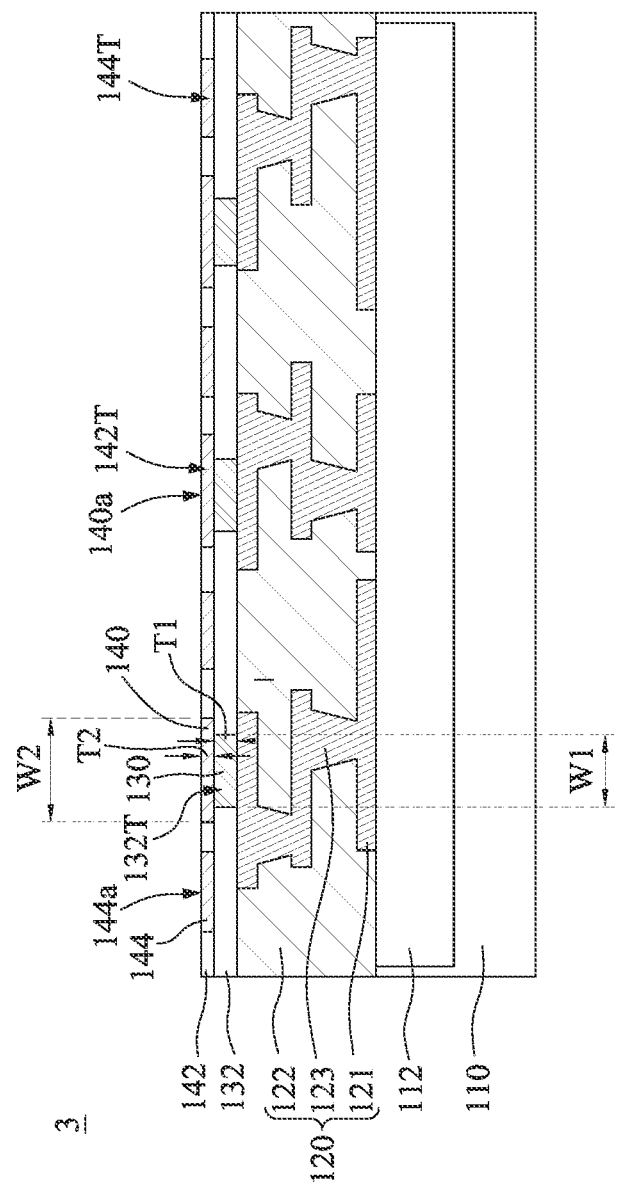
FIG. 5G illustrates one or more stages of a method of manufacturing a semiconductor structure, in accordance with some embodiments of the present disclosure.

Referring to FIG. 5G, one or more hybrid bonding pads 140 may be formed on the conductive pads 130. In some embodiments, one or more dummy pads 144 are formed on the dielectric layer 132. In some embodiments, a conductive material is deposited in the trenches 142T and 144T, and a planarization process such as a chemical mechanical polishing (CMP) may be performed to remove a portion of the conductive material and optionally a portion of the dielectric layer 142. In some embodiments, the conductive material may be deposited in the trenches 142T and 1441 by deposition, such as physical vapor deposition (PVD) or electrochemical deposition (ECD). The hybrid bonding pads 140 and the dummy pads 144 may include nano-twins copper. In some embodiments, a thickness T2 of the hybrid bonding pad 140 is substantially the same as a depth of the trench 142T. In some embodiments, a thickness of the dummy pad 144 is substantially the same as a depth of the trench 142T. As such, the semiconductor structure 3 is formed.

In some embodiments, the thickness T2 of the hybrid bonding pad 140 is less than the thickness T1 of the conductive pad 130. In some embodiments, a hybrid bonding surface (i.e., the top surface 140a) of the hybrid bonding pad 140 includes a [111] crystal plane. In some embodiments, the hybrid bonding pads 140 may be formed by forming a nano-twins copper layer in the trenches 142T. In some embodiments, at least 80% of a surface area of the hybrid bonding surface (i.e., the top surface 140a) of the hybrid bonding pad 140 is a [111] crystal plane.

Figure 5H:
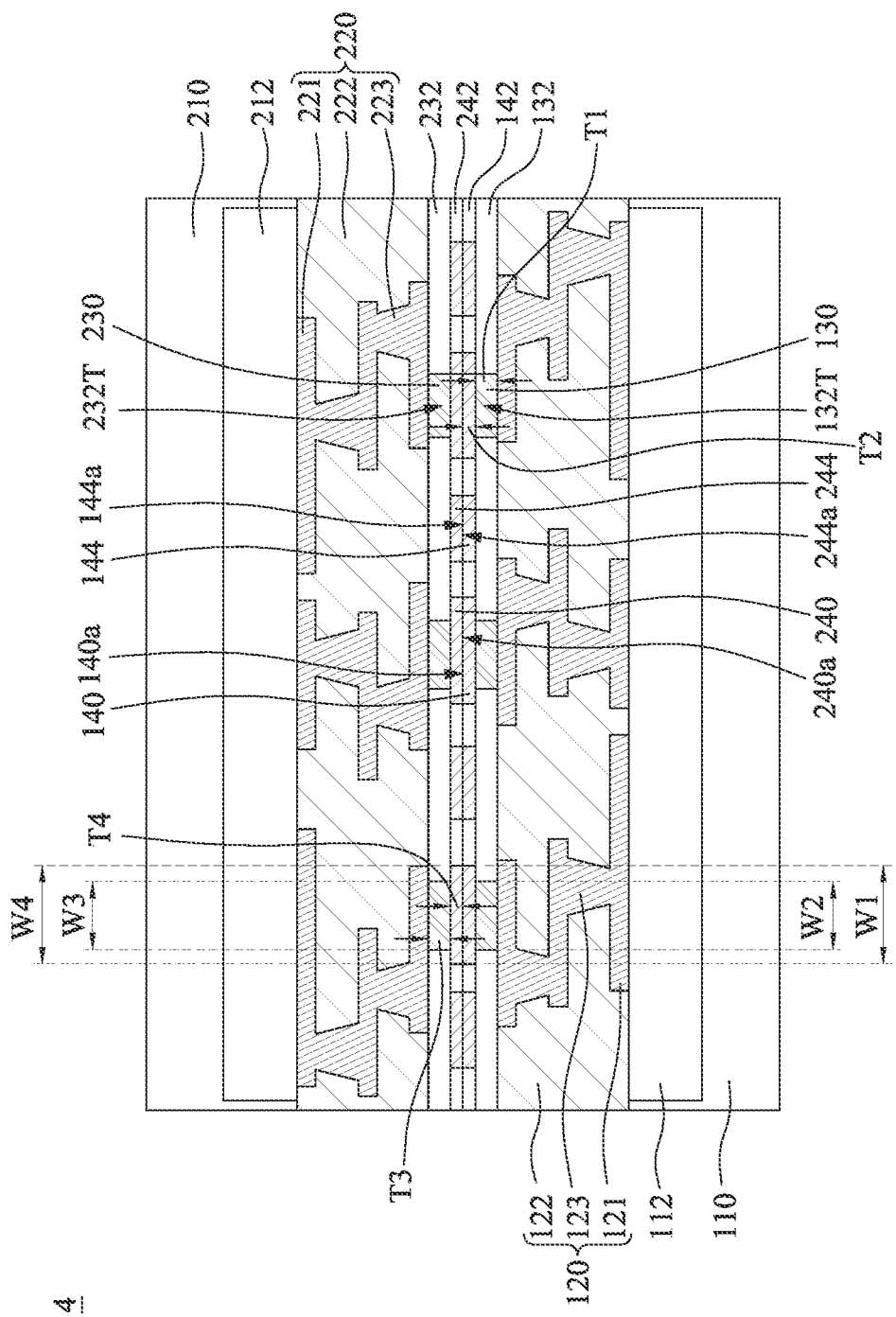
FIG. 5H illustrates one or more stages of a method of manufacturing a semiconductor structure, in accordance with some embodiments of the present disclosure.

Referring to FIG. 5H operations similar to those illustrated in FIGS. 5A-5G may be performed to provide a semiconductor substrate 210, form one or more conductive pads 230 over the semiconductor substrate 210, and form one or more hybrid bonding pads 240 on the conductive pads 230. In some embodiments, the hybrid bonding pads 240 include nano-twins copper.

Next, still referring to FIG. 5H, the semiconductor substrate 110 may be connected to the semiconductor substrate 210 by bonding the hybrid bonding pads 140 to the hybrid bonding pads 240. In some embodiments, a hybrid bonding surface (i.e., a top surface 240a) of the hybrid bonding pad 240 includes a [111] crystal plane, and a thickness T4 of the hybrid bonding pad 240 is less than a thickness T3 of the conductive pad 230. In some embodiments, the dielectric layer 142 is further bonded to the dielectric layer 242 to connect the semiconductor substrate 110 to the semiconductor substrate 210. In some embodiments, the dummy pads 144 are further bonded to the dummy pads 244 to connect the semiconductor substrate 110 to the semiconductor substrate 210. In some embodiments, the bonding is performed by an annealing process. A temperature of the annealing process may be from about 150° C. to about 350° C., from about 150° C. to about 50° C., or about 200° C.

In some embodiments, the hybrid bonding pads 140 and 240 and the dielectric layers 142 and 242 form a hybrid bonding structure which connects or assembles the semiconductor substrate 110 to the semiconductor substrate 210. In some embodiments, the hybrid bonding pads 140 and 240, the dummy pads 144 and 244, and the dielectric layers 142 and 242 form a hybrid bonding structure which connects or assembles the semiconductor substrate 110 to the semiconductor substrate 210. As such, the semiconductor structure 4 is formed.

According to some embodiments of the present disclosure, by bonding [111] nano-twins crystal planes of the hybrid bonding pads 140 and 240, since surface diffusion of copper atoms along the [111] crystal plane is significantly faster than along the [100] or [110] crystal planes, such specific [111] nano-twins crystal planes can increase the diffusion rate of copper atoms across the bonding interface so as to form relatively stable metal-to-metal bonds. Therefore, the bonding time can be reduced, the annealing temperature of the hybrid bonding process can be reduced, the stability of the hybrid bonding structure can be increased, and the bonding strength can be increased accordingly.

In addition, according to some embodiments of the present disclosure, with the arrangements of the dummy pads 144 and/or 244, the dishing effect caused by the CMP process can be mitigated or prevented. Therefore, the warpage of the planarized structure can be reduced, the hybrid bonding surface (i.e., the top surfaces of the dummy pads 144 and 244, the hybrid bonding pads 140 and 240, and the dielectric layers 142 and 242) can be relatively planarized, thereby the strength as well as the stability of the as-formed hybrid bonding structures can be increased.

Moreover, while a [111] nano-twins crystal plane of a nano-twins copper layer preferably faces a direction normal to a deposition surface of the nano-twins copper layer, a nano-twins copper layer formed on an inclined surface would have a [111] nano-twins crystal plane facing towards a tilted direction instead of facing upwards vertically (i.e., the bonding direction). Therefore, when a nano-twins copper layer is formed in a relatively deep trench or recess having inclined side surfaces, the nano-twins copper layer may have a top surface (which faces upwards vertically) having a relatively small portion of a [111] nano-twins crystal plane. In contrast, according to some embodiments of the present disclosure, with the design of the trenches 142T and/or 242T for forming the hybrid bonding pads 140/240 have a relatively small depth, the deposition surface for the hybrid bonding pads 140/240 has a relatively small inclined portion. Thus, the hybrid bonding surface(s) of the as-formed hybrid bonding pads 140/240 can have a relatively large portion being the [111] crystal plane of nano-twins copper. Therefore, the annealing time and the annealing tempera-tire for the hybrid bonding process can be further reduced, the stability of the hybrid bonding structure can be further increased, and the bonding strength can be further increased accordingly.

Furthermore, according to some embodiments of the present disclosure, with the design of the trenches 142T and/or 242T for forming the hybrid bonding pads 140/240 have a relatively small depth to obtain a relatively large portion of the bonding surface being the [111] crystal plane of nano-twins copper, the selection of the deposition technique is increased and flexible. For example, a seed layer may be omitted, and/or various deposition technique may be used to deposit the nano-twins copper in the relatively shallow trenches. Therefore, the manufacturing process is simplified and also more flexible.

Figure 6:
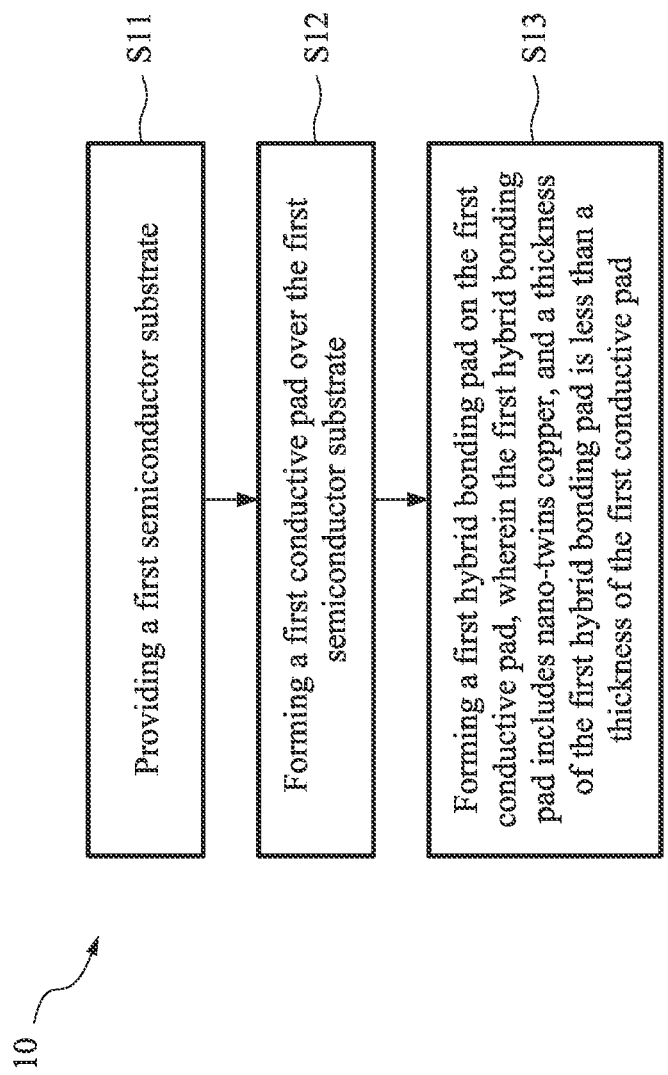
FIG. 6 is a flowchart illustrating a method of manufacturing a semiconductor structure, in accordance with some embodiments of the present disclosure.

FIG. 6 is a flowchart illustrating a method 10 of manufacturing a semiconductor device, in accordance with some embodiments of the present disclosure.

The method 10 begins with operation S11 in which a first semiconductor substrate is provided.

The method 10 continues with operation S12 in which a first conductive pad is formed over the first semiconductor substrate.

The method 10 continues with operation S13 in which a first hybrid bonding pad is formed on the first conductive pad. In some embodiments, the first hybrid bonding pad includes nano-twins copper, and a thickness of the first hybrid bonding pad is less than a thickness of the first conductive pad.

The method 10 is merely an example, and is not intended to limit the present disclosure beyond what is explicitly recited in the claims. Additional operations can be provided before, during, or after each operations of the method 10, and some operations described can be replaced, eliminated, or moved around for additional embodiments of the method. In some embodiments, the method 10 can include further operations not depicted in FIG. 6. In some embodiments, the method 10 can include one or more operations depicted in FIG. 6.

One aspect of the present disclosure provides a semiconductor structure. The semiconductor structure includes a first semiconductor substrate, a first conductive pad, and a first hybrid bonding pad. The first conductive pad is over the first semiconductor substrate. The first hybrid bonding pad is on the first conductive pad. The first hybrid bonding pad includes nano-twins copper. A thickness of the first hybrid bonding pad is less than a thickness of the first conductive pad.

Another aspect of the present disclosure provides a semiconductor structure. The semiconductor structure includes a first semiconductor device, a first conductive pad, and a first nano-twins coper pad. The first conductive pad is disposed on and electrically connected to the first semiconductor device. The first nano-twins copper pad is on the first conductive pad. A thickness of the first nano-twins copper pad is less than a thickness of the first conductive pad.

Another aspect of the present disclosure provides a method of manufacturing a semiconductor structure. The method includes providing a first semiconductor substrate. The method also includes forming a first conductive pad over the first semiconductor substrate. The method further includes forming a first hybrid bonding pad on the first conductive pad, wherein the first hybrid bonding pad includes nano-twins copper, and a thickness of the first hybrid bonding pad is less than a thickness of the first conductive pad.

In the semiconductor structure, with the design of bonding surfaces of hybrid bonding pads including [111] crystal planes of nano-twins copper, since surface diffusion of copper atoms along the [111] crystal plane is significantly faster than along the [100] or [110] crystal planes, such specific [111] nano-twins crystal planes can increase the diffusion rate of copper atoms across a bonding interface between the hybrid bonding pads so as to form relatively stable metal-to-metal bonds in a hybrid bonding structure. Therefore, the bonding time can be reduced, the annealing temperature of the hybrid bonding process can be reduced, the stability of the hybrid bonding structure can be increased, and the bonding strength can be increased accordingly.

Although the present disclosure and its advantages have been described in detail, it should be understood that various changes, substitutions and alterations can be made herein without departing from the spirit and scope of the disclosure as defined by the appended claims. For example, many of the processes discussed can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor structure, comprising:
   providing a first semiconductor substrate;
   forming a first conductive pad over the first semiconductor substrate;
   forming a first hybrid bonding pad on the first conductive pad, wherein the first hybrid bonding pad comprises nano-twins copper, and a thickness of the first hybrid bonding pad is less than a thickness of the first conductive pad;
   providing a second semiconductor substrate;
   forming a second conductive pad over the second semiconductor substrate; and
   forming a second hybrid bonding pad on the second conductive pad, wherein the second hybrid bonding pad comprises nano-twins copper.

2. The method of claim 1, wherein a hybrid bonding surface of the first hybrid bonding pad comprises a [111] crystal plane.

3. The method of claim 1, further comprising:
   forming a first dielectric layer over the first semiconductor substrate; and
   forming a first trench in the first dielectric layer.

4. The method of claim 3, wherein forming the first conductive pad comprises:
   depositing a conductive material in the first trench.

5. The method of claim 3, further comprising:
   forming a second dielectric layer on the first dielectric layer and the first conductive pad; and
   forming a second trench penetrating the second dielectric layer to expose the first conductive pad, wherein a depth of the second trench is less than a depth of the first trench.

6. The method of claim 5, wherein forming the first hybrid bonding pad comprises:
   forming a nano-twins copper layer in the second trench, wherein at least 80% of a surface area of a hybrid bonding surface of the first hybrid bonding pad is a [111] crystal plane.

7. The method of claim 1, further comprising:
   forming an interconnection structure on the first semiconductor substrate, wherein the first conductive pad is formed on the interconnection structure.

8. The method of claim 1, further comprising:
   connecting the first semiconductor substrate to the second semiconductor substrate by bonding the first hybrid bonding pad to the second hybrid bonding pad.

9. The method of claim 1, wherein a hybrid bonding surface of the second hybrid bonding pad comprises a [111] crystal plane, and a thickness of the second hybrid bonding pad is less than a thickness of the second conductive pad.

* * * * *